(12) United States Patent  
Pazhedan

(10) Patent No.: US 9,704,881 B2  
(45) Date of Patent: Jul. 11, 2017

(54) SEMICONDUCTOR DEVICE WITH REDUCED POLY SPACING EFFECT

(71) Applicant: GLOBALFOUNDRIES Inc., Grand Cayman (KY)

(72) Inventor: Naseer Babu Pazhedan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/859,914

(22) Filed: Sep. 21, 2015

(65) Prior Publication Data

US 2017/0084629 A1 Mar. 23, 2017

(51) Int. Cl.

| | |
|---|---|
| H01L 21/84 | (2006.01) |
| H01L 21/8238 | (2006.01) |
| H01L 29/78 | (2006.01) |
| H01L 27/12 | (2006.01) |
| H01L 29/66 | (2006.01) |
| H01L 21/308 | (2006.01) |
| H01L 29/165 | (2006.01) |
| H01L 21/02 | (2006.01) |
| H01L 27/092 | (2006.01) |

(52) U.S. Cl.  
CPC .... *H01L 27/1203* (2013.01); *H01L 21/02532* (2013.01); *H01L 21/308* (2013.01); *H01L 21/823814* (2013.01); *H01L 21/84* (2013.01); *H01L 27/092* (2013.01); *H01L 29/165* (2013.01); *H01L 29/66636* (2013.01); *H01L 29/7848* (2013.01)

(58) Field of Classification Search  
CPC ............... H01L 29/7848; H01L 29/165; H01L 29/66636; H01L 27/1203; H01L 27/092; H01L 21/02532; H01L 21/308; H01L 21/823814; H01L 21/84  
See application file for complete search history.

(56) References Cited

U.S. PATENT DOCUMENTS

| | | | | |
|---|---|---|---|---|
| 8,101,480 | B1 * | 1/2012 | Kim | H01L 21/823807 257/190 |
| 2006/0099751 | A1 * | 5/2006 | Miyagi | H03F 1/223 438/197 |
| 2007/0096195 | A1 * | 5/2007 | Hoentschel | H01L 21/823807 257/315 |
| 2007/0254444 | A1 * | 11/2007 | Bloomquist | H01L 21/26506 438/305 |
| 2008/0179628 | A1 * | 7/2008 | Wei | H01L 21/76256 257/190 |
| 2009/0289379 | A1 * | 11/2009 | Han | H01L 21/823807 257/368 |
| 2015/0021695 | A1 * | 1/2015 | Hu | H01L 29/785 257/368 |

* cited by examiner

*Primary Examiner* — John C Ingham  
*Assistant Examiner* — Gustavo Ramallo  
(74) *Attorney, Agent, or Firm* — Amerson Law Firm, PLLC

(57) ABSTRACT

A method of manufacturing a semiconductor device is provided including providing a semiconductor substrate with a semiconductor layer, forming a first gate electrode over the semiconductor layer, forming a second gate electrode over the semiconductor layer, forming a mask layer between the first and second gate electrodes, etching a cavity into the semiconductor layer between the first and second gate electrodes using the mask layer as an etching mask, and forming a semiconductor material in the etched cavities.

17 Claims, 5 Drawing Sheets

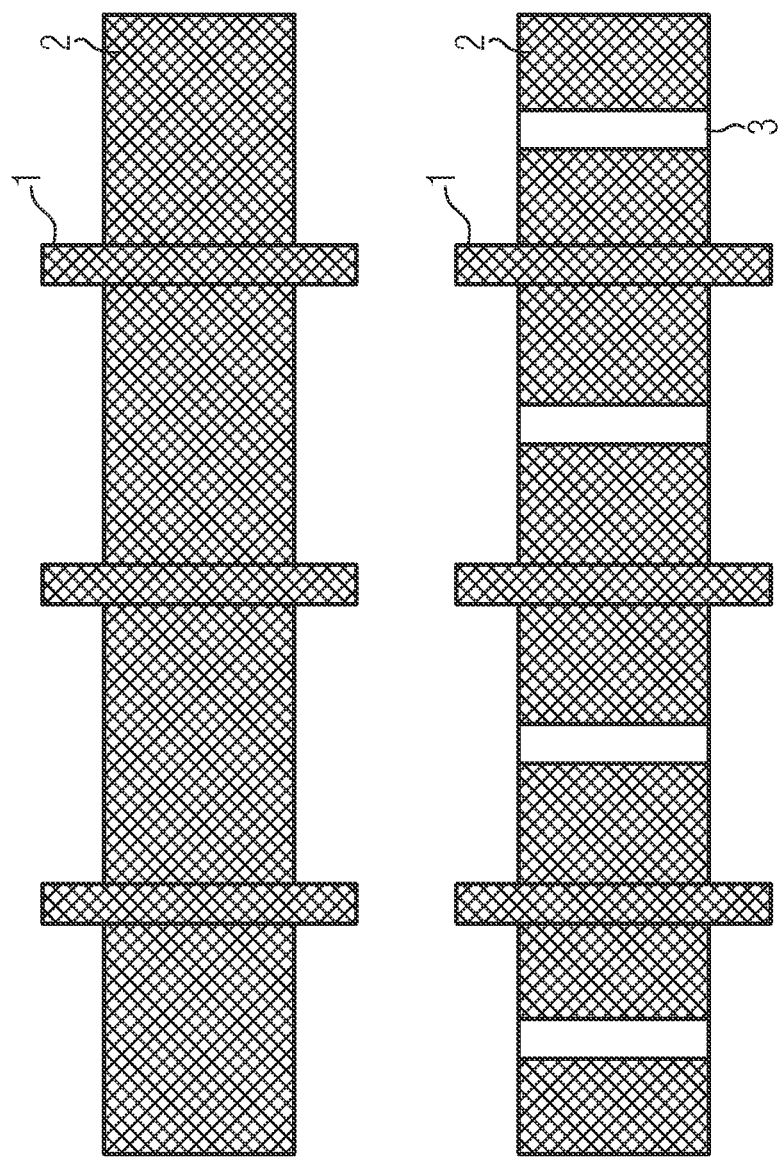

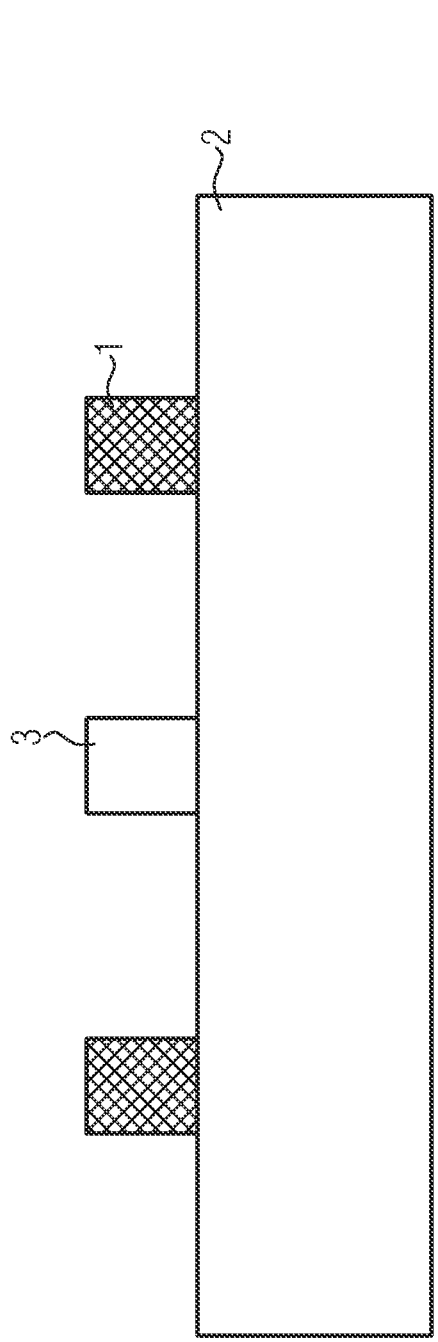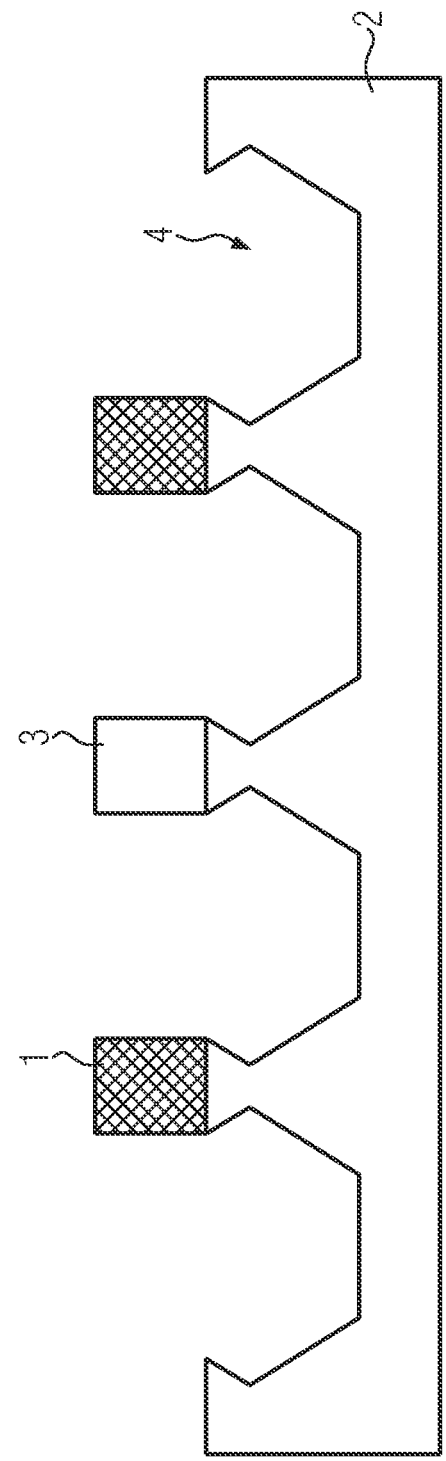

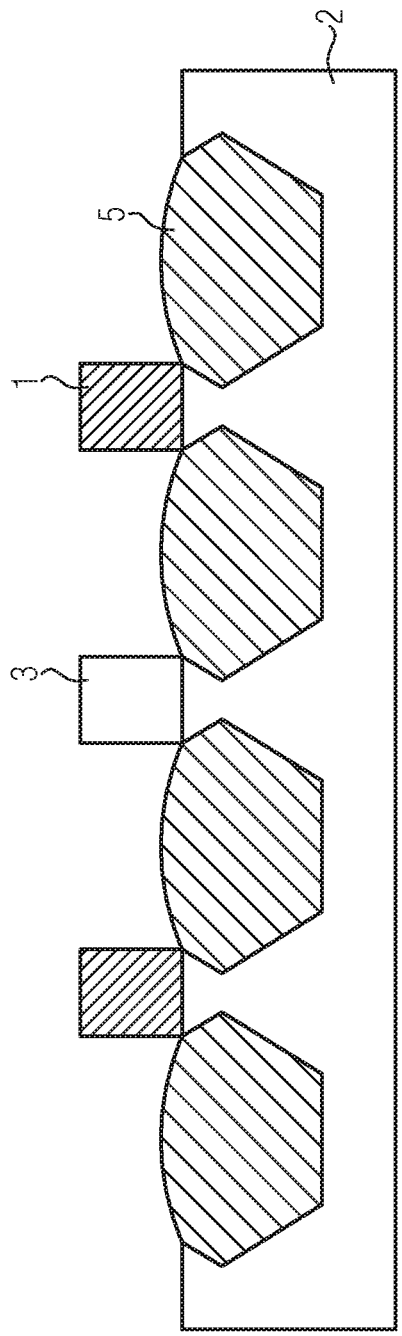
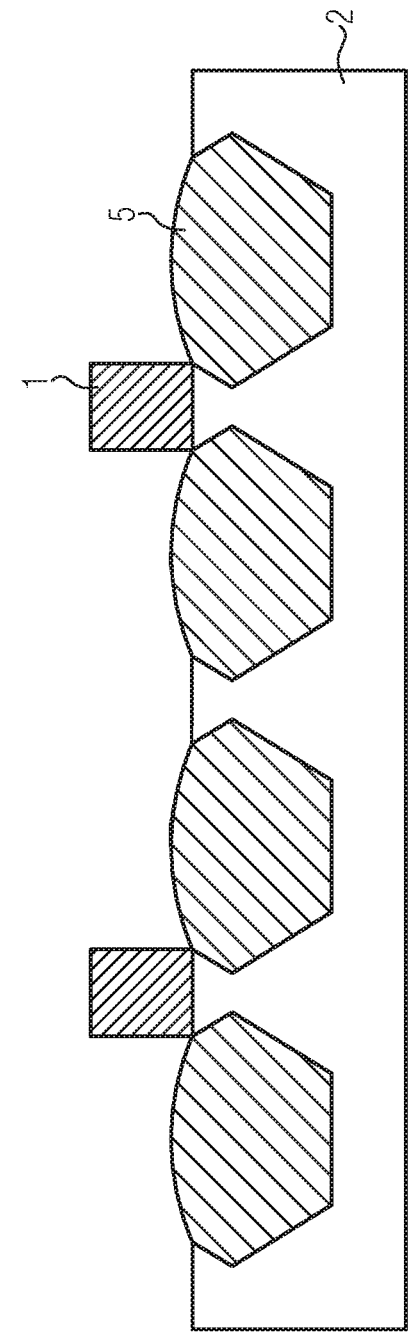

SEMICONDUCTOR DEVICE WITH REDUCED POLY SPACING EFFECT

BACKGROUND

1. Field of the Disclosure

Generally, the present disclosure relates to the field of integrated circuits and semiconductor devices, and, more particularly, to the formation of semiconductor devices comprising transistor devices having embedded stress-inducing layers in the source and drain regions adjacent to the channel regions.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. It has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the process adaptations associated with device scaling.

One efficient mechanism for increasing the charge carrier mobility is the modification of the lattice structure in the channel region, for instance, by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in the conductivity and in th performance of N-channel transistors. On the other hand, compressive strain in the channel region may increase the mobility of holes, thereby providing the potential for enhancing the performance of P-channel transistors.

Particularly, it has been proposed to introduce a silicon/germanium layer next to the channel region to induce a compressive stress that may result in a corresponding strain. The strained silicon/germanium compound, which may also be referred to as a silicon/germanium alloy, may be provided in a strained state due to a mismatch of the lattice spacing between natural silicon and natural silicon/germanium alloy. That is, the silicon/germanium material may be formed on the basis of the silicon lattice spacing, thereby resulting in a strained silicon/germanium crystal lattice, which may then interact with the neighboring semiconductor material to exert a stress and thus cause a certain strain. The transistor performance of P-channel transistors may be considerably enhanced by the introduction of stress-creating layers next to the channel region. For this purpose, a strained silicon/germanium layer may be formed in the drain and source regions of the transistors, wherein the compressively strained drain and source regions create uniaxial strain in the adjacent silicon channel region. When forming the silicon/germanium layer, the drain and source regions of the PMOS transistors are selectively recessed, while the NMOS transistors are masked and subsequently the silicon/germanium layer is selectively formed in the PMOS transistor by epitaxial growth.

However, a particular problem arises by varying distances between individual gates of transistor devices. Regions of semiconductor devices comprising transistor devices with larger gate spacing (poly spacing) have higher volumes of embedded stress-inducing material (for example, embedded silicon germanium, eSiGe) than regions with transistor devices with smaller poly spacing. Thereby, different on-currents and hence different delay times in the circuit disadvantageously result, a phenomenon known in the context of the so-called poly spacing effect.

In view of the situation described above, the present disclosure provides techniques that allow for the formation of semiconductor devices comprising field effect transistors (FETs) with embedded semiconductor material adjacent to the channel regions with relatively uniform on-currents and a reduced poly spacing effect as compared to the art.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the formation of semiconductor devices comprising transistor devices, and more particularly MOSFETs.

A method of manufacturing a semiconductor device is provided including providing a semiconductor substrate with a semiconductor layer, forming a first gate electrode over the semiconductor layer, forming a second gate electrode over the semiconductor layer, forming a mask layer between the first and second gate electrodes, etching a cavity into the semiconductor layer between the first and second gate electrodes using the mask layer as an etching mask, and forming a semiconductor material in the etched cavities.

Furthermore, a method of manufacturing a semiconductor device with P-channel and N-channel transistors is provided including forming first gate electrodes of first ones of the P-channel transistors with a first spacing over a first region of a semiconductor layer, forming a mask layer between the first gate electrodes over the semiconductor layer, etching first cavities into the first region of the semiconductor layer using the mask layer as an etching mask, and filling the first cavities with a stress-inducing semiconductor material.

In addition, a method of manufacturing a semiconductor device is provided including providing a semiconductor substrate having gate electrodes formed over a semiconductor layer of the semiconductor substrate and determining a spacing between the gate electrodes. If the determined spacing exceeds a predetermined threshold, then a mask layer is formed between the gate electrodes and cavities are formed between the gate electrodes using the mask layer an etching layer. If the determined spacing does not exceed the predetermined threshold, then cavities are formed between the gate electrodes without forming a mask layer between the gate electrodes. After the formation of the cavities, they are filled with a stress-inducing semiconductor material. The predetermined threshold may relate to design rules, for example, the gate lengths of the transistors or a critical gate-to-gate spacing.

Further, a semiconductor device is provided including a first transistor device with a first gate electrode formed over a semiconductor layer, a second transistor device with a second gate electrode formed over the semiconductor layer, a first region of a semiconductor material embedded in the semiconductor layer between the first and second transistors and with a second region of the semiconductor material embedded in the semiconductor layer between the first and second transistors. The first and second regions of the semiconductor material are at least partially separated from each other by a region of a material of the semiconductor layer.

In all of the above-mentioned examples, the gate electrodes may have polysilicon gate materials and/or metal gate materials. Transistor devices may be formed on SOI or FDSOI substrates. The semiconductor material exhibits compressive stress on the material of the semiconductor layer in channel regions of P-channel transistor devices and may comprise or be made of SiGe.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b illustrate the formation of a mask layer between gates of FETs with a relatively large spacing;

FIGS. 2a-2d illustrate formation of a semiconductor device comprising the formation of cavities for the provision of embedded semiconductor layers using a mask layer according to an example of the present disclosure;

Figure 3A:
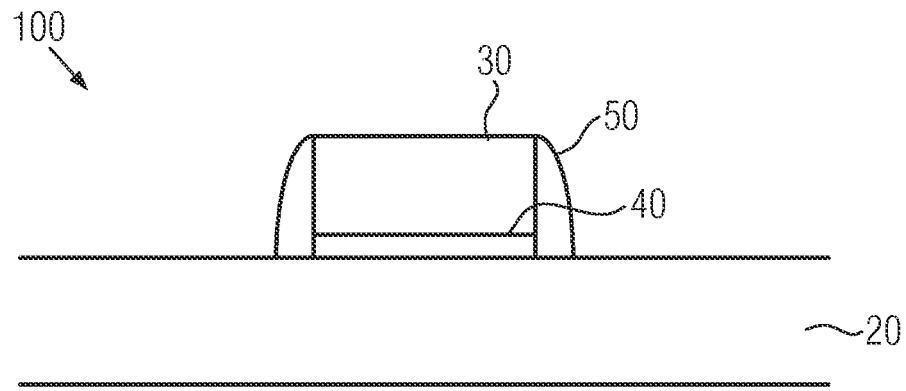
FIGS. 3a-3c illustrate the formation of a P-channel FET comprising embedded strained material in the source/drain regions.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques and semiconductor devices in which N-channel transistors and/or P-channel transistors may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides methods for stress/strain transfer in the channel region of a transistor, thereby increasing the mobility of charge carriers and the overall performance of the transistor. The stress/strain transfer may be achieved by a lattice mismatch between a first semiconductor material, for example, doped silicon, in a channel region of the transistor and an embedded second semiconductor material formed in a source/drain region of the transistor.

An example of a method of manufacturing a semiconductor device will now be described with reference to FIGS. 1a-1b. FIG. 1a shows a manufacturing stage wherein gates 1 of FETs are formed over a semiconductor layer 2 in a region of a semiconductor device or integrated circuit. The gates 1 may be formed in a sophisticated manner and may comprise metal gate and polysilicon gate materials. The semiconductor layer 2 may be comprised of any appropriate semiconductor material, such as silicon, silicon/germanium, silicon/carbon, other II-VI or III-V semiconductor compounds and the like. The semiconductor layer 2 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the semiconductor layer 2 may be part of an SOI configuration, i.e., it may be formed on a buried oxide layer which is formed on a semiconductor substrate. The semiconductor substrate may be a silicon substrate, in particular, a single crystal silicon substrate. Other materials may be used to form the semiconductor substrate such as, for example, germanium, silicon germanium, gallium phosphate, gallium arsenide, etc.

In the depicted region of the semiconductor device or integrated circuit, the spacing between individual gates 1 is relatively large, for example, more than 1.5 times the minimum design rule dimension. A spacing of 1.5 times minimum design rule means a spacing 1.5 larger than the minimum spacing of the design related to, for example, gate lengths or gate pitches (distances between gates of different transistor devices or between gates of transistor devices and dummy gates). In order to avoid relatively large regions of embedded strained semiconductor material between the gates to be formed in subsequent manufacturing steps (and, thus, in order to avoid a significant poly spacing effect) a mask layer 3 is formed between the gates 1, as shown in FIG. 1b. Here and in the following it is understood that the mask layer 3 is formed by deposition and patterning (for example, by lithographic techniques) of a masking material. The patterning results in multiple portions of the masking material all of which are comprised by the mask layer 3.

The mask layer 3 may be formed of an oxide material, for example, of a material comprising silicon oxide. In particular, the mask layer 3 may be formed in the middle between two neighbored gates (poly lines). The width of the mask layer 3 may be chosen dependent on the gate length. For example, a width of the mask layer 3 that is about equal to the minimum gate length (in the direction from left to right in FIG. 1b) of the design rule may be considered appropriate. The length of the mask layer 3 may correspond to the width of the channel region (in the direction perpendicular to the gate length, i.e., from top to bottom in FIG. 1b). Both the mask layer 3 and the gates 1 are used as etching masks for etching cavities into the semiconductor layer 2 to be filled with a stress-inducing material as described below. By employment of the mask layer 3, an unintentionally high stress due to an excessively large region of a subsequently to be formed embedded stress-inducing material may be avoided. The region shown in FIG. 1a may be neighbored by a region with a relatively small gate (poly) spacing where no formation of a mask layer is needed.

FIG. 2a shows a side view of the configuration illustrated in FIG. 1b. The mask layer 3 and the gates 1 are used as etching masks for etching cavities 4, as illustrated in FIG. 2b. The cavities 4 may be sigma-shaped, hexagonal-shaped, diamond-shaped or u-shaped, for example. The cavities 4 may be accomplished by applying an anisotropic plasma assisted etch process. The depth of the cavity strongly depends on the process parameters of the corresponding plasma assisted etch process. Particularly, below the mask layer 3, a thin strip of the material of the semiconductor layer 2, for example, a thin silicon strip, is retained. It is noted that this thin strip does not significantly affect the electrical properties of the finally built semiconductor device. In particular, the thin strip may have a width at the upper surface of the semiconductor layer 2 (from left to right in FIG. 2b) less than 10%, or 5%, of the overall width (from left to right in FIG. 2b) of the cavities 4 at the upper surface of the semiconductor layer 2.

In the manufacturing state shown in FIG. 2c, the cavities 4 are filled with a stress-inducing semiconductor material 5, for example, SiGe. The regions of the stress-inducing semiconductor material 5 are at least partially separated from each other by the thin strip of the material of the semiconductor layer 2. In particular, the thin strip may have a minimum lateral width at some location (from left to right in FIG. 2c) less than 10%, or 5%, of the maximum lateral width (from left to right in FIG. 2c) of the regions of the stress-inducing semiconductor material 5.

By adjusting the germanium content of the silicon/germanium compound, the strain level induced in the channel region of a P-channel transistor can be controlled. For example, a germanium content of 20 atomic percent to 30 atomic percent can suitably be chosen to achieve a compressive stress level of about 1 GPa in the channel region of a P-channel transistor. The silicon/germanium compound (or other chosen material) may be epitaxially grown on the material of the semiconductor layer 2 within the cavities 4. Particular preparation for the selective deposition of the stress-inducing semiconductor material 5 in the cavities 4 which may involve a plurality of cleaning recipes and the like may be included in the process flow. After completion of the formation of the stress-inducing semiconductor material 5, the mask layer 3 is removed, as shown in FIG. 2d.

Figure 3B:
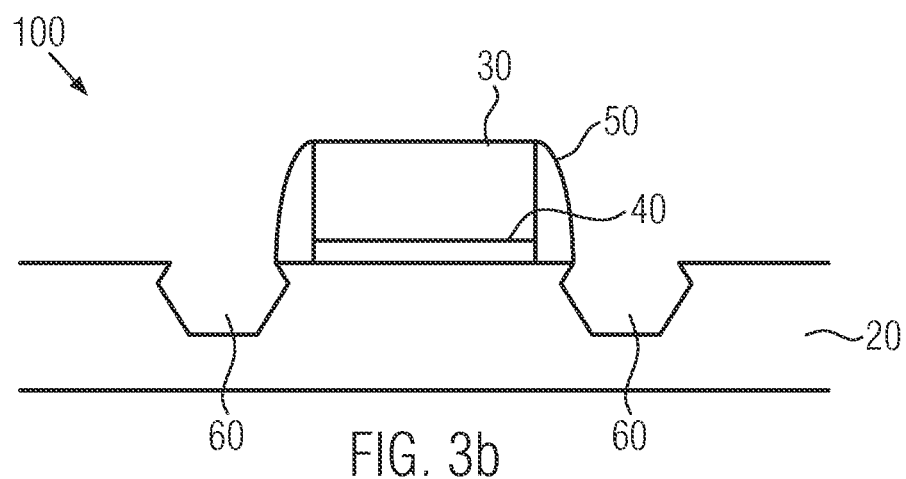
Figure 3C:
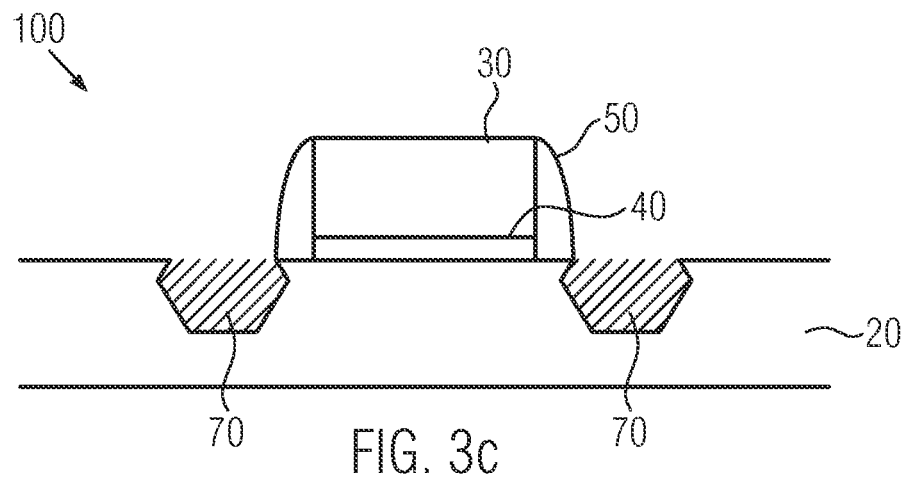

Formation of a P-channel transistor that may be integrated in the process flow illustrated in FIGS. 2a-2d is shown in FIGS. 3a-3c. In the manufacturing state shown in FIG. 3a, a P-channel transistor 100 formed over a semiconductor layer 20 comprises a gate electrode 30, a gate dielectric 40 and sidewall spacers 50 formed at the sidewalls of the gate electrode 30. A channel region of the P-channel transistor 100 is formed in the semiconductor layer 20. The semiconductor layer 20 may be comprised of any appropriate semiconductor material, such as silicon, silicon/germanium, silicon/carbon, other II-VI or III-V semiconductor compounds and the like. The semiconductor layer 20 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the semiconductor layer 20 may be part of an SOI or Fully Depleted SOI (FDSOI) configuration. The semiconductor substrate may be a silicon substrate, in particular, a single crystal silicon substrate.

The gate dielectric 40 may be comprised of silicon dioxide, silicon nitride, a combination thereof, or any appropriate high-k dielectric material, possibly in combination with one or more of the conventional dielectrics mentioned before. In this respect, a high-k dielectric material may be understood as a dielectric material having a relative permittivity of approximately 10 or higher. For example, a plurality of metal oxides may provide the required insulating characteristics and may have a moderately high dielectric constant, such as hafnium oxide, zirconium oxide, aluminum oxide and the like. For example, a high-k dielectric material layer may be provided in the gate dielectric 40 possibly in combination with a "conventional" dielectric material, such as a silicon dioxide base material, and the like. In sophisticated applications, the conventional dielectric layer, if provided, may have a thickness of 1 nm or less, while the high-k dielectric material layer may have a thickness of one to several nanometers. The gate dielectric 40 may be formed by oxidation and/or chemical vapor deposition.

The gate electrode 30 may comprise a metal-containing layer formed on the dielectric layer 40. The metal-containing layer may comprise at least one of titanium nitride (TiN), tantalum nitride (TaN), tantalum (Ta), tungsten (W), for example. The metal-containing layer may be relatively thin with a thickness below 50 nm, in particular, below 20 nm.

Moreover, the metal-containing layer may include a work function adjusting material, for example, TiN. In particular, the metal may a work function adjusting material that comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm. Moreover, the effective work function of the metal gate may be adjusted by added impurities, for example, Al, C or F. In addition, the gate electrode material 30 may comprise a semiconductor layer, for example, comprising polysilicon, above the metal-containing layer. The semiconductor layer of the gate electrode 30 may comprise un-doped poly-crystalline silicon.

The sidewall spacers 50 may be formed of silicon nitride or silicon oxide, for example. Formation of the sidewall spacers 50 may comprise forming a dielectric layer over the gate electrode 30 and the semiconductor layer 20 and performing reactive ion etching to remove the dielectric material from the top of the electrode layer 30 and the semiconductor layer 20 to form the sidewall spacers 50 on the sidewalls of the gate electrode 30.

In the manufacturing state shown in FIG. 3b, cavities 60 are formed on both sides of the channel region of the transistor device 100. The gate electrode 30 and the sidewall spacers 50 function as etching masks during the etching of the cavities 60. In addition, mask layer 3 shown in FIGS. 1b and 2a-2c may function as an etching mask.

A stress-inducing material 70, for example, SiGe, may be formed in the cavities 60, as shown in FIG. 3c. For example, the stress-inducing material is epitaxially grown by a selective growth process to a thickness that is sufficient to fill the cavities 60. Methods for epitaxially growing these materials on a silicon host in a selective manner are well known and need not be described herein. SiGe has a greater lattice constant than silicon and a compressive longitudinal stress is applied to the transistor channel. The compressive longitudinal stress increases the mobility of holes in the channel and hence improves the performance of the P-channel field effect transistor 100.

The stress-inducing material 70 may be doped in order to form source/drain regions of the transistor device 100. In principle, doping may be performed after formation of the stress-inducing material 70 in the cavities 60 formed in the semiconductor layer 20 and/or during the growth of the stress-inducing material 70 in the cavities. The gate electrode 30 and sidewall spacer 50 of the P-channel transistor 100 may be used as an implantation mask for doping the regions laterally adjacent to the gate electrode 30 in order to form the source/drain regions.

After formation of the source/drain regions of the P-channel transistor 100 (which may include an appropriate anneal treatment for activating the implants), a silicidation for improving the contact properties of both the gate electrode 30 and the source/drain electrodes may be performed. The silicidation process may start with deposition of a metal film, typically nickel, followed by a heating step triggering a chemical reaction between the metal particles of the deposited film and the gate electrode 30 and source/drain regions formed in the semiconductor layer 20.

The process flows of the above-described examples may be integrated in CMOS processing wherein both N-channel and P-channel MOS transistor devices are formed. Shallow trench isolations may be formed for separating the active regions of the N-channel and P-channel transistor devices. During etching of the cavities 4 shown in FIG. 2b and cavities 60 shown in FIG. 3b, N-channel transistor devices may be protected against the etching by means of a mask layer, in particular, an oxide mask layer. The mask layer may be deposited, for example, to a thickness of about 50 nm or more by low pressure chemical vapor deposition (LPCVD) from a tetraethylorthosilicate (TEOS) source. The mask layer may be patterned, for example, by using conventional photoresist patterning and etching steps, to remove the layer from the P-channel transistor 33 retaining the layer overlying the N-channel transistor. The same mask layer used to protect the N-channel transistor against the etching may be patterned to also provide the mask layer 3 shown in FIGS. 1*b* and 2*a*-2*c*.

Figure 4:
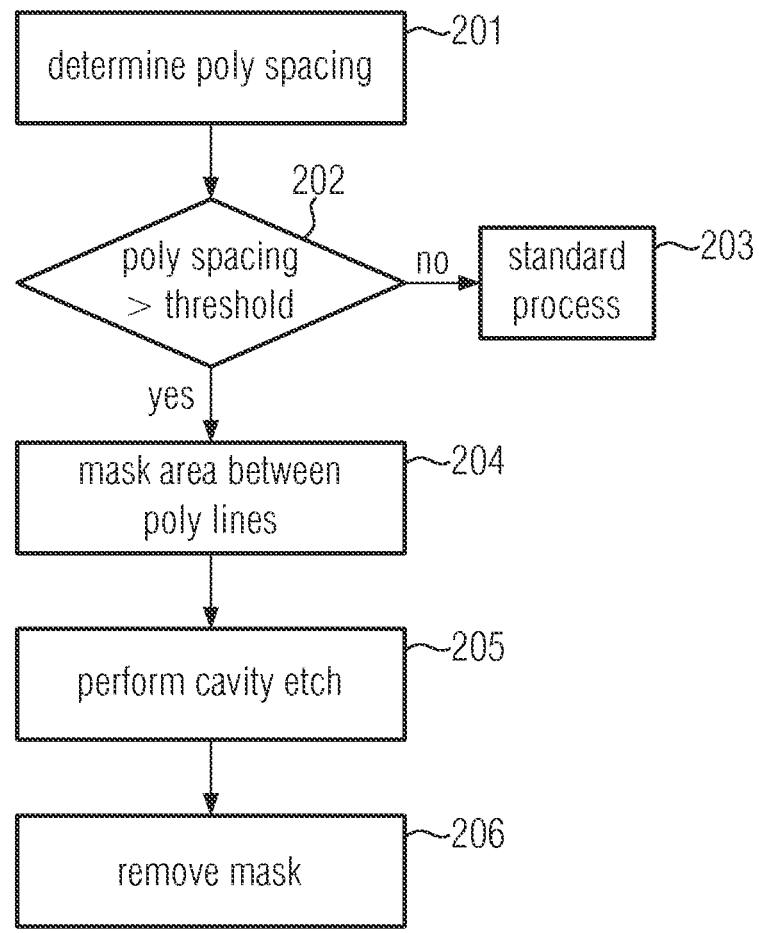
FIG. 4 is a flow chart illustrating an example of a method of manufacturing a semiconductor device according to the present disclosure.

FIG. 4 represents a flow chart illustrating a method of manufacturing a semiconductor device according to the teachings disclosed herein. In an intermediate processing step, a wafer with gate structures of P-channel FETs formed thereon is provided. The poly spacing (gate-to-gate distance) is determined at step 201. If it is determined at step 202 that the poly spacing is below a predetermined threshold, no modification with respect to standard processing known in the art is necessary as indicated at 203. If it is determined at step 202 that the poly spacing is above the predetermined threshold, a mask layer is formed between the gates (poly lines) as indicated at step 204. The predetermined threshold may be chosen based on the design rule. For example, it may be chosen from the interval of 1.1 to 1.9 of the minimum design rule (minimum gate-to-gate spacing according to the design), in particular, to be about 1.5 times the minimum design rule.

In particular, an area about the center of a region between neighbored gates with a poly spacing below the predetermined threshold may be masked by a mask layer. The mask layer may be exactly centered between the gates. The mask layer may be formed by oxide deposition. The same oxide may be used that is needed for forming a masking layer over a region of the wafer where N-channel transistors are formed. In fact, forming the mask layer between the gates and the masking layer over a region of the wafer where N-channel transistors are formed may be done in the same process step(s).

As shown in FIG. 4, a cavity etch in a semiconductor layer of the wafer providing an active layer is performed at step 205 after the formation of the mask layer and using the same as an etching mask. After completion of the etching process, the mask layer is removed at step 206.

As a result, the present disclosure provides techniques of manufacturing semiconductor devices wherein excessive stress induced in transistor channels by embedded semiconductor materials may be avoided and the poly spacing effect caused by large gate-to-gate distances, in particular, in the context of P-channel MOSFETS comprising embedded stress-inducing material adjacent to the channel regions, may be efficiently alleviated by the provision of mask layers between the gates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a semiconductor device, the method comprising:
    providing a semiconductor substrate having a semiconductor layer;
    forming a first gate electrode over said semiconductor layer;
    forming a second gate electrode over said semiconductor layer and laterally adjacent to said first gate electrode;
    forming a mask layer in a space between said laterally adjacent first and second gate electrodes, wherein said mask layer exposes each of said laterally adjacent first and second gate electrodes, covers a first portion of said semiconductor layer in said space between said laterally adjacent first and second gate electrodes, and exposes second portions of said semiconductor layer in said space between said mask layer and each of said laterally adjacent first and second gate electrodes;
    etching a cavity into each of said exposed second portions of said semiconductor layer in said space between said laterally adjacent first and second gate electrodes using said mask layer as an etching mask;
    forming a semiconductor material in said etched cavities; and
    removing said mask layer after forming said semiconductor material.

2. The method of claim 1, further comprising forming a first P-channel transistor having said first gate electrode and forming a second P-channel transistor having said second gate electrode and forming source/drain regions in said semiconductor material.

3. The method of claim 1, wherein said semiconductor material is a stress-inducing material comprising one of silicon and a mixture of silicon and germanium and wherein said semiconductor layer comprises silicon.

4. The method of claim 1, further comprising:
    forming a first P-channel transistor comprising said first gate electrode;
    forming a second P-channel transistor comprising said second gate electrode;
    forming an N-channel transistor comprising a third gate electrode over said semiconductor layer; and
    forming said mask layer over said third gate electrode and over regions of said semiconductor layer adjacent to said third gate electrode.

5. The method of claim 1, wherein said semiconductor substrate is one of an SOI and an FDSOI substrate.

6. The method of claim 1, wherein said mask layer that is formed between said first and second gate electrodes comprises a lateral width of about 0.8 to 1.2 times a lateral width of one of said first and second gate electrodes.

7. A method of manufacturing a semiconductor device, the method comprising:
    forming a plurality of laterally adjacent first gate electrodes of a plurality of respective first P-channel transistors with a first gate electrode spacing over a first region of a semiconductor layer;
    forming a plurality of third gate electrodes of a plurality of respective N-channel transistors over a third region of said semiconductor layer;
    forming a mask layer, over each of said plurality of third gate electrodes, over portions of said third region of said semiconductor layer adjacent to each of said plurality of third gate electrodes, and in first spaces defined between each of said plurality of laterally adjacent first gate electrodes formed over said first region of said semiconductor layer, wherein said mask layer exposes each of said plurality of laterally adjacent first gate electrodes, covers a first portion of said semiconductor layer positioned in said respective first spaces between each of said plurality of laterally adjacent first gate electrodes, and exposes second portions of said semiconductor layer positioned in said respective first spaces between each of said plurality of laterally adjacent first gate electrodes;

etching first cavities into each of said exposed second portions of said first region of said semiconductor layer in each of said respective first spaces using said mask layer as an etching mask;

filling said first cavities with a first stress-inducing semiconductor material; and removing said mask layer after forming said first stress-inducing semiconductor material.

8. The method of claim 7, further comprising:

forming a plurality of laterally adjacent second gate electrodes of a plurality of respective second P-channel transistors with a second gate electrode spacing over a second region of said semiconductor layer, said second gate electrode spacing being smaller than said first gate electrode spacing, wherein second spaces are defined between each of said plurality of laterally adjacent second gate electrodes;

etching second cavities into said second region of said semiconductor layer in said respective second spaces between each of said plurality of laterally adjacent second gate electrodes without using an etching mask positioned in said respective second spaces; and filling said second cavities with a second stress-inducing semiconductor material.

9. The method of claim 7, wherein portions of said mask layer formed in said first spaces between said plurality of laterally adjacent first gate electrodes are centered between said respective first gate electrodes.

10. The method of claim 7, wherein portions of said mask layer formed in said first spaces between said plurality of laterally adjacent first gate electrodes comprise a lateral width of 0.8 to 1.2 times a lateral width of said respective first gate electrodes.

11. A method of manufacturing a semiconductor device, the method comprising:

providing a semiconductor substrate comprising laterally adjacent gate electrodes formed over a semiconductor layer of said semiconductor substrate;

determining a gate electrode spacing between said laterally adjacent gate electrodes;

if said determined gate electrode spacing exceeds a predetermined threshold, then forming a mask layer in a space defined between said laterally adjacent gate electrodes and forming cavities in said semiconductor layer in said space defined between said gate electrodes using said mask layer an etching mask, wherein said mask layer exposes each of said laterally adjacent gate electrodes and said semiconductor layer positioned in said space between said mask layer and each of said respective laterally adjacent gate electrodes;

if said determined gate electrode spacing does not exceed said predetermined threshold, then forming cavities in said semiconductor layer in said space defined between said laterally adjacent gate electrodes without forming a mask layer in said space between said laterally adjacent gate electrodes;

filling said cavities with a stress-inducing semiconductor material; and removing said mask layer after forming said stress-inducing semiconductor material.

12. The method of claim 11, wherein said semiconductor substrate is one of an SOI and an FDSOI substrate, said semiconductor layer comprises silicon and said stress-inducing material comprises one of silicon and a mixture of silicon and germanium.

13. The method of claim 11, wherein said semiconductor substrate further has additional gate electrodes and wherein said mask layer is formed as part of a masking material layer formed over said additional gate electrodes and over regions of said semiconductor layer adjacent to said additional gate electrodes.

14. The method of claim 11, wherein said laterally adjacent gate electrodes are formed immediately adjacent one another such that no additional gate electrodes are formed therebetween prior to forming said cavities in said semiconductor layer.

15. A method of manufacturing a semiconductor device having P-channel and N-channel transistors, the method comprising:

forming a plurality of first gate electrodes of a plurality of respective first P-channel transistors with a first gate electrode spacing over a first region of a semiconductor layer;

forming a plurality of second gate electrodes of a plurality of respective second P-channel transistors with a second gate electrode spacing smaller than said first gate electrode spacing over a second region of a semiconductor layer;

forming a mask layer in a first space defined between each of said plurality of first gate electrodes formed over said first region of said semiconductor layer;

etching first cavities into said first region of said semiconductor layer in said first spaces defined between each of said plurality of first gate electrodes using said mask layer formed in each of said respective first spaces as an etching mask;

etching second cavities into said second region of said semiconductor layer in said second spaces defined between each of said plurality of second gate electrodes without using a mask layer positioned in any of said respective second spaces;

filling said first cavities with a first stress-inducing semiconductor material; and filling said second cavities with a second stress-inducing semiconductor material.

16. The method of claim 1, wherein said second gate electrode is formed immediately adjacent to said first gate electrode such that no additional gate electrodes are formed in said space therebetween prior to etching said cavities into said exposed second portions of said semiconductor layer.

17. The method of claim 7, wherein said plurality of laterally adjacent first gate electrodes are formed immediately adjacent one another such that no additional gate electrodes are formed therebetween prior to etching said first cavities into said exposed second portions of said first region of said semiconductor layer.

* * * * *